(12) United States Patent
Abe

(10) Patent No.: US 6,799,305 B2
(45) Date of Patent: Sep. 28, 2004

(54) METHOD FOR LAYING OUT ELECTRONIC CIRCUIT AND PROGRAM THEREOF

(75) Inventor: Hiroshi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 47 days.

(21) Appl. No.: 10/112,703

(22) Filed: Apr. 2, 2002

(65) Prior Publication Data

US 2002/0194574 A1 Dec. 19, 2002

(30) Foreign Application Priority Data

Apr. 9, 2001 (JP) ........................................ 2001-110251

(51) Int. Cl.[7] .............................................. G16F 17/50
(52) U.S. Cl. ..................... 716/2; 716/1; 716/6; 716/12; 716/13; 716/14
(58) Field of Search ............................. 716/1, 2, 6, 12, 716/13, 14

(56) References Cited

U.S. PATENT DOCUMENTS 6,209,123 B1 * 3/2001 Maziasz et al. ................ 716/14
6,651,237 B2 * 11/2003 Cooke et al. .................. 716/13

FOREIGN PATENT DOCUMENTS

JP          2000-163460 A        6/2000

* cited by examiner

*Primary Examiner*—Thuan Do
(74) *Attorney, Agent, or Firm*—Sughrue Mion, PLLC

(57) ABSTRACT

In circuit wire layout designing, a method for laying out an electronic circuit, capable of ensuring signal reliability, is provided. A net list of an electronic circuit as a design target is input and an layout plan is set (step S1). The information of the structure of a disposed wire and an electrical characteristic of an electronic part connected to the wire is input (step S2) and a normal operation condition of a signal in a receiver of the wire is input (step S3). The maximum wire length is calculated from those input data (step S4), it is compared with a wire length in the layout plan (step S5), by performing rearrangement of layout until the wire length of the layout becomes not more than the maximum wire length, an layout ensuring a normal operation is obtained (step S6).

5 Claims, 2 Drawing Sheets

METHOD FOR LAYING OUT ELECTRONIC CIRCUIT AND PROGRAM THEREOF

BACKGROUND OF THE INVENTION (i) Field of the Invention

The present invention relates to methods for laying out electronic circuits and programs thereof wherein the maximum wire length ensuring a normal operation in a unit of each wire is calculated when a layout of an electronic circuit is designed.

(ii) Description of the Related Art

Conventionally, in wiring layouts of electronic circuits, a problem of conversion of digital logic circuit information into geometric configuration information has been regarded as most important. Taking in various techniques, laying out at very high density and with efficiency has become possible. However, because any distinct index from the viewpoint of signal reliability has not been given, problems that a completed circuit does not operate or is instable have occurred particularly in highly integrated circuits such as LSIs (Large Scale Integrations).

For developing circuits that operate stably, a countermeasure by experimental knowledge is required. For example, for taking matching in impedance between circuit elements, or for satisfying a delay restriction of a path, circuit elements may be disposed by a manual work in designing a layout, and/or a logic connection relation may be altered a manual work. As a result, there is a wide difference between a less experienced engineer and a well experienced engineer. However, even if well experienced, the engineer can not always design a circuit that operates normally, where there is indeterminacy.

Methods to solve such problems in designing stage have been proposed. In Japanese Patent Application Laid-open No. 2000-163460, a wiring imaginary capacitance of a wire is introduced out in designing a layout, and a permissible current quantity of the wire and a wire width that allows the permissible current to flow are calculated. The layout processing is performed on the basis of those permissible current quantity and wire width.

However, according to the prior art disclosed in the Japanese Patent Application Laid-open No. 2000-163460, the wiring capacitance which is a physical quantity as a concentrated (lumped) constant, is used for evaluation of signal reliability. It is an improper index for a high-speed digital circuit wherein characteristics as a transfer line of distributed constant series becomes remarkable. Besides, there is also inconvenience that a delay library is necessary in advance.

SUMMARY OF THE INVENTION

The present invention has been made by taking the above circumstances into consideration, and its object is to provide a method for laying out electronic circuits and a program thereof, capable of defining restriction of wire length from the viewpoint of signal reliability and ensuring signal reliability in designing a layout.

According to one feature of the present invention, there is provided a method for laying out an electronic circuit, which method comprises the first step of inputting a net list of an electronic circuit as a design target, and setting a plan of an layout from the net list; the second step of inputting a structure of each wire and an electrical characteristic of a circuit element connected to the wire, on the basis of the net list; the third step of inputting a condition for a circuit element connected to a terminal end of the wire to operate normally; the fourth step of calculating a maximum wire length that ensure to operate normally, using parameters input in the second step and the third step; the fifth step of comparing a wire length based on the plan of the layout and the maximum wire length; and the sixth step of again setting a plan of an layout in case that the wire length based on the plan of the layout is longer than the maximum wire length as a result of comparing in said fifth step.

The second step of the method of the present invention preferably inputs a dielectric constant of a substrate, a path impedance of the wire, and impedances of circuit elements connected to both ends of the wire.

Further, the third step of the method of the present invention preferably inputs an upper limit value of a signal delay time and a threshold of a voltage in which circuit elements connected to both end of the wire can operate normally.

Moreover, the fourth step of the method of the present invention preferably calculates the propagation velocity on the basis of a dielectric constant of a substrate, preferably calculates a reflection period and a reflection frequency on the basis of the propagation velocity, preferably calculates ratios of reflection (reflectances) of circuit elements connected to both ends of the wire, on the basis of a path impedance of the wire and impedances of the circuit elements, respectively, preferably substitutes the propagation velocity, the reflection period, the reflection frequency, the ratios of reflection, and the condition input in the third step for a relational expression of a voltage change in relation to time of a signal propagating in the wire, and calculates the maximum wire length on the basis of the relational expression.

According to the other aspect of the present invention, there is provided a program causing a computer to execute a procedure of setting a plan of an layout from a net list of an electronic circuit as a design target; a procedure of calculating a maximum wire length ensured to operate normally,. from each wire structure, an electrical characteristic of a circuit element connected to the wire, and a condition for a circuit element connected to a terminal end of the wire to operate normally, input on the basis of the net list; a procedure of comparing a wire length based on the plan of the layout and the maximum wire length; and a procedure of again setting a plan of an layout in case that the wire length is longer than the maximum wire length from the comparison result.

Moreover, the procedure of calculating a maximum wire length of the program of the present invention preferably includes a calculation of a propagation velocity on the basis of a dielectric constant of a substrate, a calculation of a reflection period and a reflection frequency on the basis of the propagation velocity, and a calculation of ratios of reflection of circuit elements connected to both ends of the wire, on the basis of a path impedance of the wire and impedances of the circuit elements, respectively.

Furthermore, the procedure of calculating a maximum wire length of the program of the present invention preferably includes substitutions of said propagation velocity, the reflection period, the reflection frequency, the ratios of reflection, and the normally operating conditions of the circuit element for a relational expression of a voltage change in relation to time of a signal propagating in the wire.

DETAILED DESCRIPTION OF THE PREFERRED EMBODIMENT

Hereinafter, an embodiment of this invention will be described with reference to drawings. A method for laying out an electronic circuit according to this embodiment is characterized in that, in addition to a conventional technology in which a physical configuration is determined from digital logic circuit information, to a driver, a receiver, and a wire interconnecting them, when a signal excited from the driver propagates to the receiver via the wire, taking notice to that the signal is multi-reflected between the driver and receiver with converging, a wire length restriction for satisfying necessary conditions concerning time and signal intensity required on the receiver side in the viewpoint of signal reliability is provided.

Figure 1:
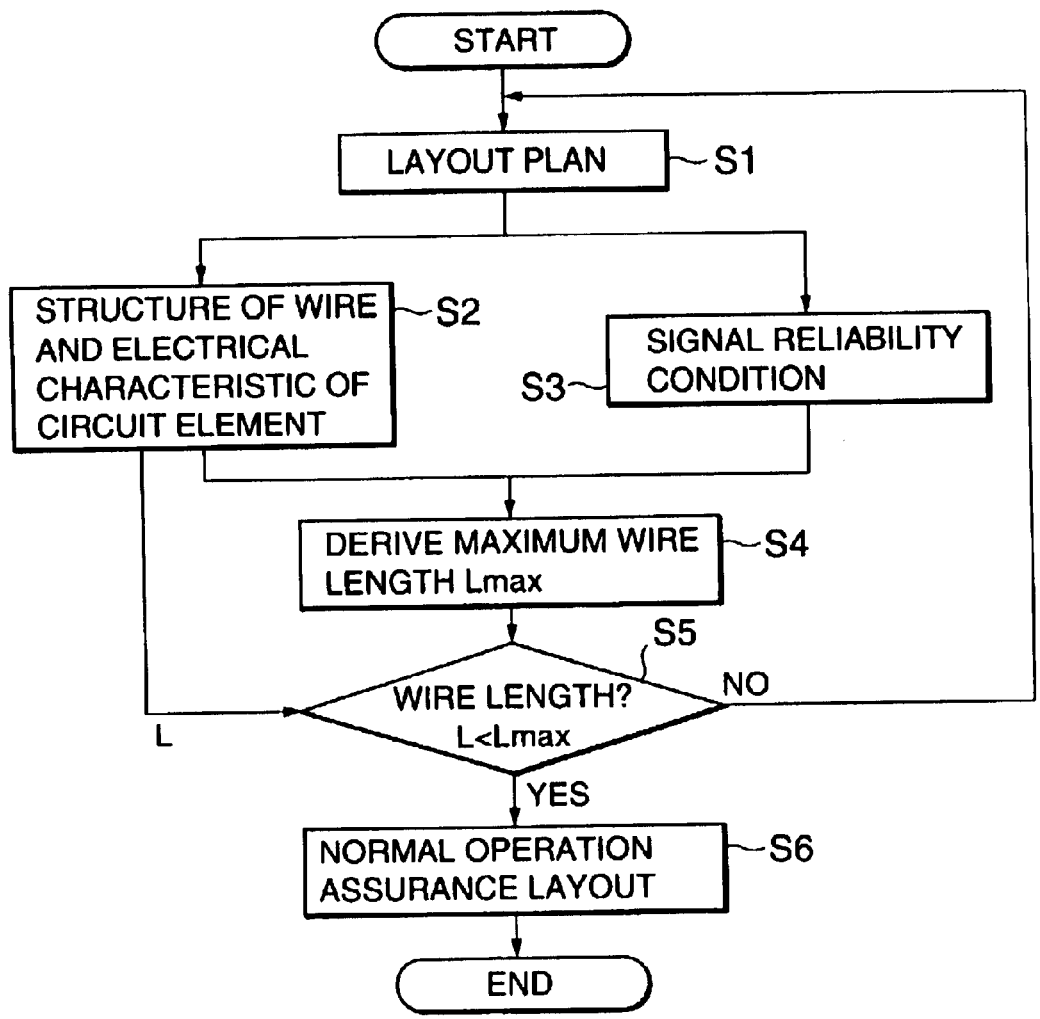
FIG. 1 is a flowchart for explaining a layout designing method according to an embodiment of the present invention.

More specifically explaining below, FIG. 1 is a flowchart for explaining the laying out method according to this embodiment. First, an layout plan of a configuration of semiconductor elements, LSIs, and so on, and wires interconnecting them, is prepared from a logic design of a circuit according to a conventional technology (step S1). At this time, for each of the wires, reflectance (ratio of reflection) of the signal driver and receiver at the both ends, and a propagation velocity of an electric signal determined from the structure and electrical characteristics of the wire and the substance around it is input (step S2). Further, signal reliability conditions such as time delay, threshold of signal intensity, and so on, for normally operating on the receiver side received the electric signal excited in the driver are input (step S3). Next, wire length is calculated from those input data (step S4), and this maximum wire length and the wire length according to the layout plan prepared in step S1 are compared (step S5). Then, by changing the layout so as to satisfy this maximum wire length restriction, an layout made an operation assurance is provided in the designing stage (step S6).

Thus, according to the above embodiment, the maximum wire length in which an operation of the receiver is ensured is calculated, and by applying layout processing within a range of that maximum wire length, a highly reliable layout can be obtained.

Next, with reference to drawings, a maximum wire length calculating method of the same embodiment will be described.

Figure 2:
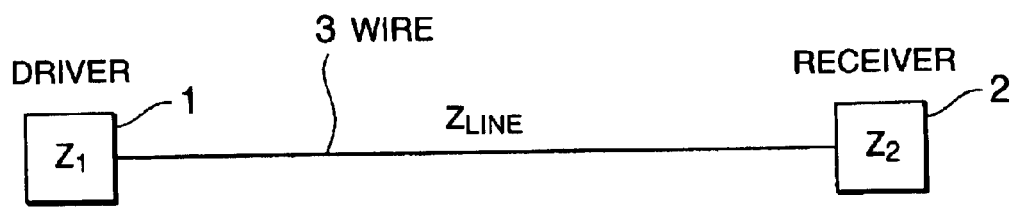
FIG. 2 is a diagram showing a fundamental structure of a wire on a layout according to the embodiment.
Figure 3:
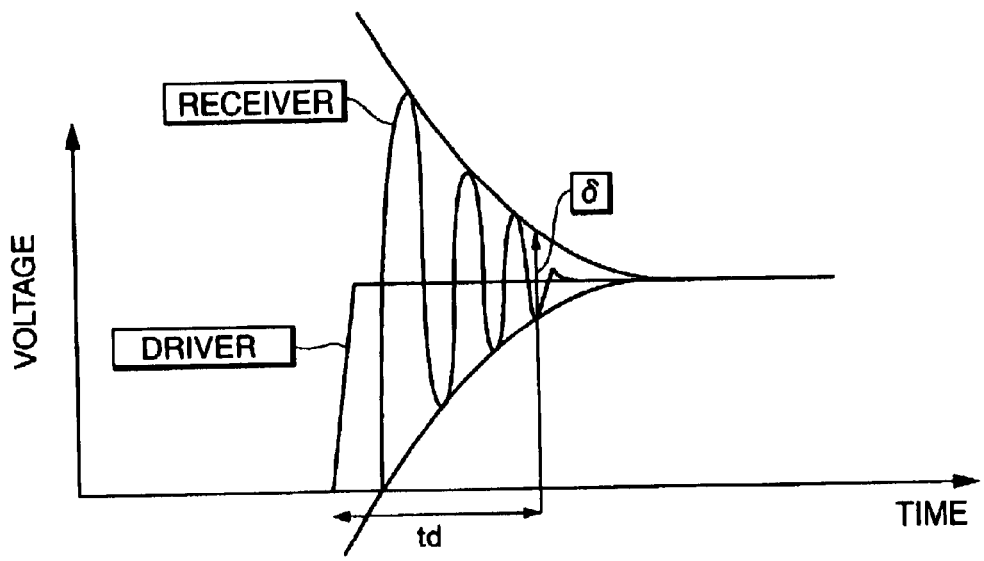
FIG. 3 is a graph showing changes in voltage with time on a driver side and a receiver side of the embodiment.
Figure 4:
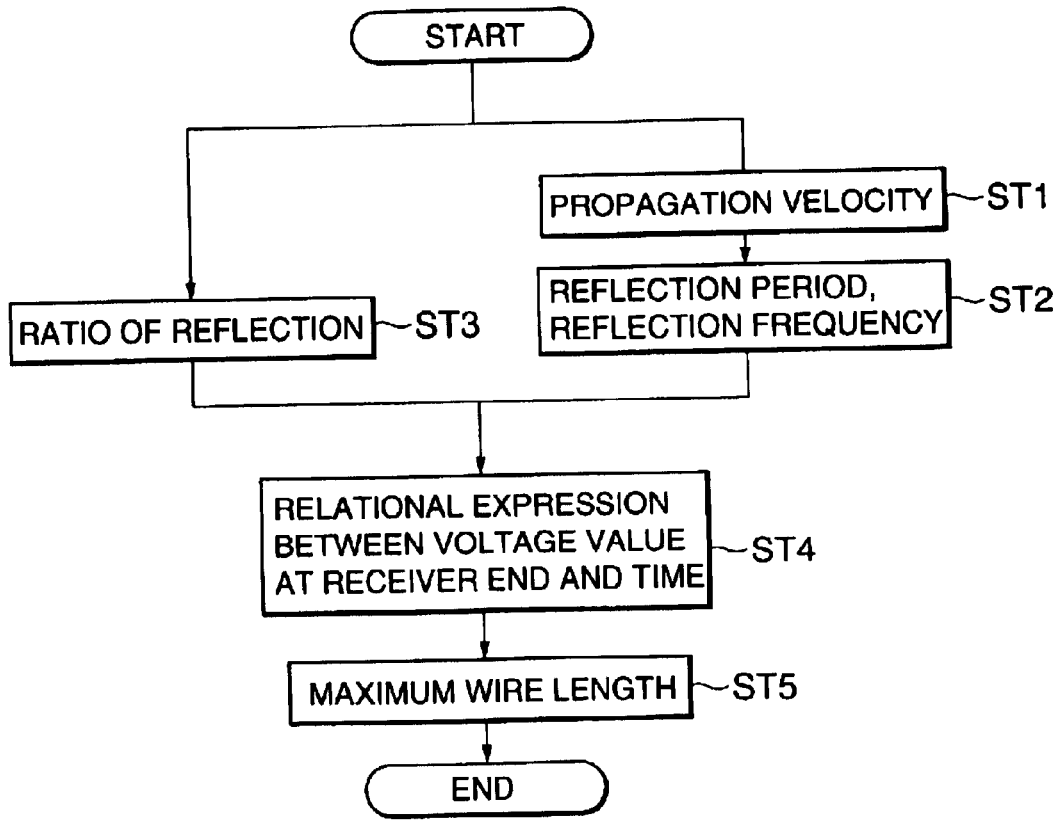
FIG. 4 is a flowchart showing a maximum wire length calculating procedure in the layout designing method of the embodiment.

FIG. 2 shows a fundamental structure of a layout, and FIG. 3 is a graph showing voltage change of signal at each circuit element end connected to a wire with respect to elapse time. FIG. 4 is a flowchart showing a calculating procedure of the maximum wire length calculating method.

In FIG. 2, reference numeral 1 denotes a driver for driving a wire 3, wherein the output impedance of the driver 1 is $Z_1$. Reference numeral 2 denotes a receiver to receive a signal that the driver 1 excites, wherein the input impedance of the receiver 2 is $Z_2$. Besides, assume that the path impedance of the wire 3 connected to the driver 1 and the receiver 2 is $Z_{Line}$. The wire 3 may be a micro-strip line formed on a dielectric substrate which is provided on a ground plate. The micro-strip line forms distributed constant circuit, and has a characteristic impedance $Z_{Line}$ as the path impedance.

In FIG. 3, reference td represents the upper limit value of delay time that the receiver 2 can normally operate, and reference δ represents a threshold that the receiver 2 can normally operate.

First, a net list of an electronic circuit as a design target is input. On the basis of the input net list, each circuit element is disposed, wiring between those circuit elements, and a layout plan is set. On the basis of the layout plan, the structure of each wire and electrical characteristics between circuit elements of that wire are input.

From the structure of the input wire, when the signal that the driver 1 excites is assumed as a TEM (Transverse Electro Magnetic) wave as micro-strip mode, the propagation velocity $V_C$ of this signal is known to be a value that the light speed is divided by the square root of the dielectric constant of a substrate. In step ST1, from the dielectric constant, the propagation velocity $V_C$ is calculated.

In step ST2, from the propagation velocity $V_C$ calculated in step ST1, the reflection period T and reflection frequency $f_{ref}$ of a signal on the wire are calculated using the following expression (1). Note that reference L represents the length of the wire.

$$f_{ref} = \frac{1}{T} = \frac{V_c}{2L} \quad (1)$$

In step ST3, the reflectances (ratios of reflection) of the driver and receiver are derived. The reflectances of the driver and receiver can be examined from actual measurement, besides they can be also calculated from electrical characteristics of circuit elements and wires. For example, in FIG. 2, the output impedance of the driver 1 is $Z_1$, the input impedance of the receiver 2 is $Z_2$, and the path impedance, that is, characteristic impedance of the wire 3 interconnecting the driver 1 and the receiver 2 is $Z_{Line}$. From the aforementioned impedances, the reflectance (ratio of reflection) $R_1$ at the driver end and the reflectance (ratio of reflection) $R_2$ of the receiver are derived using the following expressions (2) and (3).

$$R_1 = \left| \frac{Z_1 - Z_{Line}}{Z_1 + Z_{Line}} \right| \quad (2)$$

$$R_2 = \left| \frac{Z_2 - Z_{Line}}{Z_2 + Z_{Line}} \right| \quad (3)$$

In step ST4, if the reflectance $R_1$ of the driver and the reflectance $R_2$ of the receiver are given, a voltage change in relation to elapsed time of the propagating signal can be represented by a relation expression (4) shown below.

$$\delta = 2 R_1^{f_{ref}(td-T/2)} \cdot R_2^{f_{ref}(td+T/2)} \quad (4)$$

In FIG. 3, because the signal that the driver excites is multi-reflected between the driver and receiver with converging, for the receiver side normally operating, the signal that the driver excites has converged up to the threshold δ during the delay time td at the receiver end. Therefore, the reflection period T and the reflection frequency $f_{ref}$ at this limit point must satisfy the above expression (4).

In step ST5, substituting the expressions (1), (2) and (3) for the expression (4), the wire length L that satisfies this equation is the maximum wire length Lmax that the receiver is ensured to operate normally.

$$L_{max} = \frac{V_c}{2} \cdot \frac{\{td(\log R_1 + \log R_2) - \frac{T}{2}(\log R_1 - \log R_2)\}}{\log \frac{\delta}{2}} \quad (5)$$

Thus, from the viewpoint of signal reliability, the maximum wire length of the wires laid out can be calculated.

Note that, in the aforementioned embodiment, in place of originally preparing step S4 for calculating the maximum wire length from input data, by analyzing using a widely used signal reliability simulator, a highly accurate design can also be performed.

Besides, check of the maximum wire length restriction of the aforementioned electronic circuit wires can also be beforehand incorporated in step S1 for preparing a layout plan, thereby being able to expect a higher-speed process.

As described above, according to this invention, by defining restriction of wire length from the viewpoint of signal reliability, an effect that signal reliability can be ensured in layout designing can be obtained, besides an effect that experimental knowledge of a layout designer becomes unnecessary can be obtained.

What is claimed is:

1. A method for laying out an electronic circuit, said method comprising:

the first step of inputting a net list of an electronic circuit as a design target, and setting a plan of a layout from said net list;

the second step of inputting a structure of each wire and an electrical characteristic of a circuit element connected to said wire, on the basis of said net list;

the third step of inputting a condition for a circuit element connected to a terminal end of said wire to operate normally;

the fourth step of calculating a maximum wire length that ensures to operate normally, using parameters input in said second step and said third step;

the fifth step of comparing a wire length based on the plan of said layout and said maximum wire length;

the sixth step of again setting a plan of an layout in case that the wire length based on the plan of said layout is longer than said maximum wire length as a result of comparing in said fifth step;

wherein said second step inputs a dielectric constant of a substrate, a path impedance of the wire, and impedances of circuit elements connected to both ends of said wire.

2. The method for laying out an electronic circuit according to claim 1, wherein said third step inputs an upper limit value of a signal delay time and a threshold of a voltage in which circuit elements connected to both end of said wire can operate normally.

3. A method for laying out an electronic circuit, said method comprising:

the first step of inputting a net list of an electronic circuit as a design target, and setting a plan of a layout from said net list;

the second step of inputting a structure of each wire and an electrical characteristic of a circuit element connected to said wire, on the basis of said net list;

the third step of inputting a condition for a circuit element connected to a terminal end of said wire to operate normally;

the fourth step of calculating a maximum wire length that ensures to operate normally, using parameters input in said second step and said third step;

the fifth step of comparing a wire length based on the plan of said layout and said maximum wire length;

the sixth step of again setting a plan of an layout in case that the wire length based on the plan of said layout is longer than said maximum wire length as a result of comparing in said fifth step, wherein said fourth step calculates a propagation velocity on the basis of a dielectric constant of a substrate, calculates reflection period and a reflection frequency on the basis of said propagation velocity, calculates ratios of reflection of circuit elements connected to both ends of said wire, on the basis of a path impedance of the wire and impedances of the circuit elements, respectively, substitutes said propagation velocity, said reflection period, said reflection frequency, said ratios of reflection, and the condition input in said third step for a relational expression of a voltage change in relation to time of a signal propagating in said wire, and calculates the maximum wire length on the basis of said relational expression.

4. A program causing a computer to execute:

a procedure of setting a plan of an layout from a net list of an electronic circuit as a design target;

a procedure of calculating a maximum wire length ensured to operate normally, from each wire structure, an electrical characteristic of a circuit element connected to said wire, and a condition for a circuit element connected to a terminal end of said wire to operate normally, input on the basis of said net list:

a procedure of comparing a wire length based on the plan of said layout and said maximum wire length;

a procedure of again setting a plan of an layout in case that said wire length is longer than said maximum wire length from said comparison result wherein said procedure of calculating a maximum wire length includes a calculation of a propagation velocity on the basis of a dielectric constant of a substrate, a calculation of a reflection period and a reflection frequency on the basis of said propagation velocity, and a calculation of ratios of reflection of circuit elements connected to both ends of said wire, on the basis of a path impedance of the wire and impedances of the circuit elements, respectively.

5. A program causing a computer according to claim 4, wherein said procedure of calculating a maximum wire length further includes substitutions of said propagation velocity, said reflection period, the reflection frequency, the ratios of reflection, and the normally operating condition of the circuit element for a relational expression of a voltage change in relation to time of a signal propagating in said wire.

* * * * *